United States Patent [19]

Cernea et al.

[11] Patent Number: 5,422,842

[45] Date of Patent: Jun. 6, 1995

[54] METHOD AND CIRCUIT FOR SIMULTANEOUSLY PROGRAMMING AND VERIFYING THE PROGRAMMING OF SELECTED EEPROM CELLS

[75] Inventors: Raul-Adrian Cernea, Cupertino; Sanjay Mehrotra, Milpitas; Douglas J. Lee, San Jose, all of Calif.

[73] Assignee: SunDisk Corporation, Santa Clara, Calif.

[21] Appl. No.: 89,175

[22] Filed: Jul. 8, 1993

[51] Int. Cl.$^6$ .............................................. G11C 11/34
[52] U.S. Cl. ..................................... 365/185; 365/168
[58] Field of Search .............. 365/185, 189.09, 189.07, 365/207, 218, 168

[56] References Cited

U.S. PATENT DOCUMENTS

| | | | |
|---|---|---|---|
| 4,279,024 | 7/1981 | Schrenk | 365/203 |
| 4,357,685 | 11/1982 | Daniele et al. | 365/185 |
| 4,460,981 | 7/1984 | Van Buskirk et al. | 365/104 |
| 4,460,982 | 7/1984 | Gee et al. | 365/104 |
| 4,890,259 | 12/1989 | Simko | 365/45 |
| 4,989,179 | 1/1991 | Simko | 365/45 |
| 5,043,940 | 8/1991 | Harari | 365/168 |
| 5,303,189 | 4/1994 | Devin et al. | 365/189.06 |

OTHER PUBLICATIONS

"Non-Volatile Memories," by Raul-Adrian Cernea, et al., ISSCC paper, Session 10, 1989.
"An Improved Method for Programming a Word-Erasable EEPROM," by Torelli et al. vol. LII, N.6 Nov.–Dec. 1983, pp. 487–494.

*Primary Examiner*—Joseph A. Popek
*Assistant Examiner*—A. Zarabian
*Attorney, Agent, or Firm*—Majestic, Parsons, Siebert & Hsue

[57] ABSTRACT

A method and circuit programs and automatically verifies the programming of selected EEPROM cells without alternating between programming and reading modes like prior art methods and circuitry. The circuitry includes a programming circuit and a bit line voltage regulation circuit. The programming circuit further includes a novel sense amplifier which unlike prior art sense amplifiers, is operable during both cell reading and programming modes. Included in the sense amplifier are two current providing circuits. A first circuit provides current to a selected EEPROM cell which is sufficient for reading the programmed state of the cell, and a second circuit which automatically provides additional current when required, for programming the cell. The sense amplifier detects when programming of a selected EEPROM cell has completed and causes programming of that cell to be terminated. The voltage regulation circuitry regulates the bit line voltage to the selected EEPROM cell's drain electrode. The programming circuitry, including the sense amplifier, and voltage regulation circuitry are shown to be shared between a plurality of bit lines through a bit line selection circuit.

3 Claims, 8 Drawing Sheets

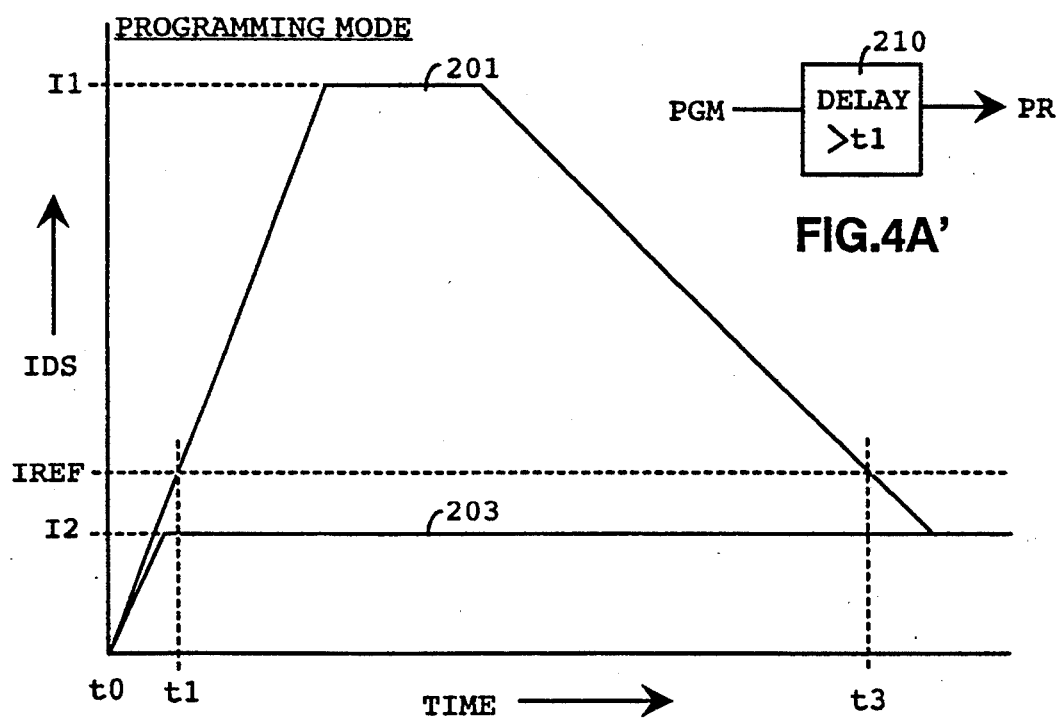
FIG.4A
FIG.4A'
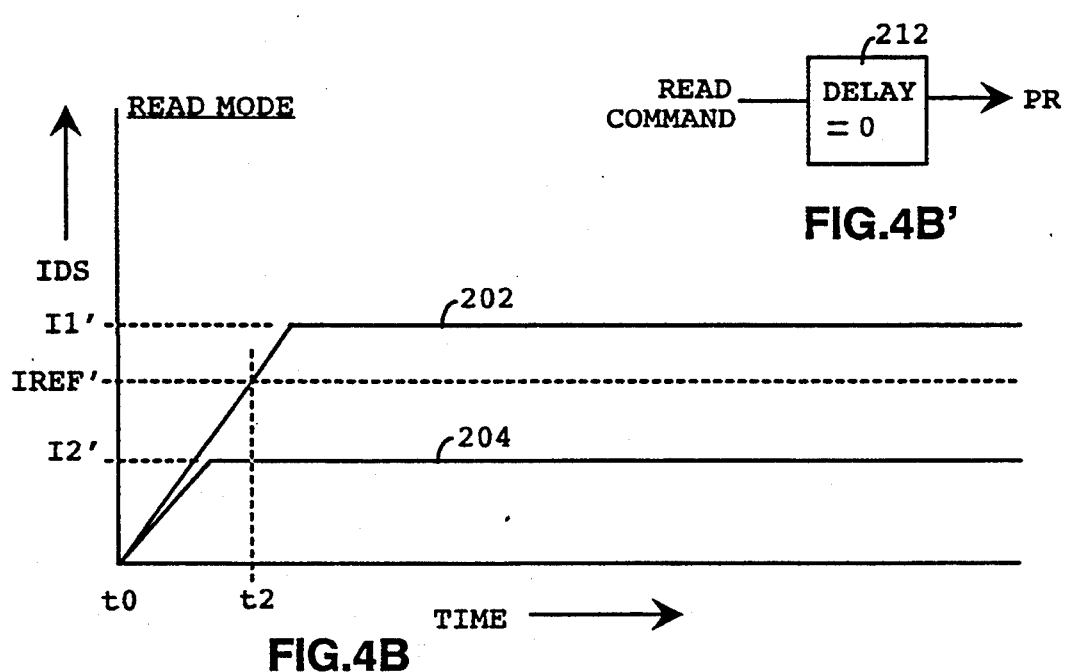
FIG.4B
FIG.4B'

METHOD AND CIRCUIT FOR SIMULTANEOUSLY PROGRAMMING AND VERIFYING THE PROGRAMMING OF SELECTED EEPROM CELLS

BACKGROUND OF THE INVENTION

This invention relates in general to electrically erasable and programmable read-only memories ("EEPROMs") and in particular, to a method and circuit which minimizes the programming time for individual and blocks of memory cells in an EEPROM by simultaneously programming and verifying the programming of each EEPROM cell being programmed.

The relative advantages of EEPROM technology over other solid-state memory technologies, are well known. For example, unlike dynamic random access memories ("DRAMs") and static random access memories ("SRAMs"), EEPROMs are non-volatile memory devices. Therefore, unlike DRAMs and SRAMs, information stored in an EEPROM is not lost when power to the EEPROM is turned off.

Also, unlike masked read-only memories ("ROMs") and programmable read-only memories ("PROMs"), neither of which are erasable, and electrically programmable read-only memories ("EPROMs"), which require special fixtures and ultra-violet light for erasing, EEPROMs are both electrically programmable and electrically erasable. Therefore, unlike ROMs, PROMs and EPROMs, an EEPROM can be readily erased and reprogrammed incircuit, i.e., without removing the EEPROM from a printed circuit board ("PCB").

The number of times that a conventional EEPROM cell can be erased and reprogrammed, however, is limited (e.g., 10,000 to 100,000). Presumably, such limitation is attributable to charge accumulated in a first isolation layer between a floating gate and a drain region of the EEPROM cell, built up by repeated programming of the EEPROM cell, and/or to charge accumulated in a second isolation layer between the floating gate and an erase gate of the EEPROM cell, built up by repeated erasing of the EEPROM cell.

In addition to limiting the useful life of an EEPROM cell, charge accumulation in the isolation layers also increases the time required to effectively program and erase the EEPROM cell. Consequently, since there may be significant variation in the number of times that different cells in the EEPROM cell array are programmed and/or erased, there may be, as a result, significant variation in the time required to effectively program and/or erase different cells in the EEPROM cell array.

This variation in the required programming and erasing times between different cells in the EEPROM cell array over the operational life of the EEPROM causes significant control problems for circuitry designed to program or erase selected cells in the EEPROM cell array. For example, if the programming circuitry is designed such that it provides a programming pulse of the same magnitude and width each time a cell in the EEPROM cell array is to be programmed, then the pulse would have to be of a sufficient magnitude and width to ensure that even the hardest to program EEPROM cells get programmed. Typically, such a pulse width or duration may need to be as long as 100 $\mu$sec.

Since most cells, especially virgin cells (i.e., EEPROM cells which have never been programmed), could be effectively programmed much sooner than 100 $\mu$sec., such an extended programming period not only unduly delays the programming process, but also reduces the reliability and life of the cells. Accordingly, iterative program-verify techniques using a series of shorter pulses (e.g., 2 $\mu$sec.) have been developed wherein between each of the shorter pulses a read verification of the cell is conducted. Upon such read verification, if the cell has not programmed, then the cell is subjected to another short pulse. On the other hand, if the cell has programmed, then the pulses stop.

Although the above discussion has been limited, for simplicity, to bi-state EEPROM cells, it is also applicable to the programming of multi-state EEPROM cells. A description of multi-state EEPROM cells and an example of an iterative program-verify technique for programming such cells is described in U.S. Pat. No. 5,043,940, entitled "Flash EEPROM Memory Systems Having Multistate Storage Cells," issued to Harari and assigned to the same assignee as the present invention, which patent is herein incorporated by reference.

Iterative program-verify techniques, however, provide less than optimal programming operation. The shifting back and forth between programming and reading modes typically requires processor intervention, thus interrupting the processor from other important tasks, and the accumulated time spent in the reading modes unduly adds to the overall programming time for the EEPROM cell. Consequently, although such iterative program-verify techniques are improvements over the single pulse of fixed magnitude and duration approach, they are still clearly worthy of further improvement.

OBJECTS AND SUMMARY OF THE INVENTION

Accordingly, one object of the present invention is to develop a programming method and circuit that minimizes the overall programming time required for programming and verifying the programming of memory cells in an EEPROM.

Another object of the present invention is to develop a programming method and circuit that minimizes the amount of processor intervention required for programming and verifying the programming of memory cells in an EEPROM.

Still another object of the present invention is to develop a programming method and circuit that increases the reliability and operating life of the memory cells in an EEPROM.

These and additional objects are accomplished by the various aspects of the present invention, wherein briefly stated, one aspect of the invention is a method of programming an EEPROM cell, comprising the steps of: providing a first voltage to a control gate of the cell, connecting a drain electrode of the cell to a second voltage, and connecting a source electrode of the cell to ground, wherein the first and second voltages are of sufficient magnitude to program the cell; sensing a current $I_{DS}$ flowing between the drain and source electrodes of the cell while the drain electrode of the cell is connected to the second voltage, and comparing the sensed current against a reference current, wherein the reference current is greater than an expected current level for the cell after it is programmed and less than an expected current level for the cell before it is programmed; and disconnecting the drain electrode of the cell from the second voltage when the sensed current is falling and becomes less than or equal to the reference current.

The above method can be used to program one or each of a plurality of EEPROM cells being programmed at the same time (i.e., in parallel). When programming a plurality of EEPROM cells at the same time, however, it is preferable to also include the step of generating a programming completion signal after programming of all of the plurality of EEPROM cells has completed. The programming completion signal can then be detected by a processor so that it can initiate the programming of another one or plurality of EEPROM cells in parallel. Thus, time is not wasted when sequentially programming individual ones or sets of EEPROM cells.

Another aspect of the present invention is a programming circuit which simultaneously programs and verifies the programming of a selected EEPROM cell. The programming circuit includes a sense amplifier for sensing a drain to source current $I_{DS}$ (also referred to herein as "cell current") flowing through a selected EEPROM cell while programming that cell. Initially, the cell current $I_{DS}$ will be very large since the EEPROM cell is still in its unprogrammed state. Once the cell current $I_{DS}$ drops below a reference current $I_{REF}$, the programming circuit automatically stops programming the selected EEPROM cell.

Another aspect of the present invention is a sense amplifier, included in the preferred embodiment of the programming circuit, which detects when a cell current $I_{DS}$ of a selected EEPROM cell falls to or below a reference current $I_{REF}$ while programming the selected EEPROM cell. Upon such detection, the sense amplifier causes additional programming of the selected EEPROM cell to terminate. An unique feature of the sense amplifier of the present invention is its ability to operate in both reading and programming modes, whereas prior art sense amplifiers generally only operate in the reading mode.

The reason why prior art sense amplifiers are incapable of operating in the programming mode is that they are generally not designed to provide the additional current required for the programming mode. For example, when programming an unprogrammed EEPROM cell, the unprogrammed cell may draw a peak current of 200 μA when 8 volts are applied across its drain and source electrodes, whereas in the reading mode, the unprogrammed cell (i.e., a cell in a logic "0" state) may only draw 20 μA when 1.5 volts are applied across its drain and source electrodes.

The sense amplifier of the present invention is capable of operating in both the programming and reading modes, because it includes two current providing circuits which are selectively connectable to a bit line connected to a drain electrode of an EEPROM cell being programmed. A first circuit is connected to a current source, and provides the selected EEPROM cell with current up to a reference current $I_{REF}$. As long as the current being drawn by the selected EEPROM cell through the bit line connected to its drain electrode is less than $I_{REF}$, the second circuit is inactive. When the current being drawn by the selected EEPROM cell exceeds $I_{REF}$, then the second circuit is activated and provides additional current to the selected EEPROM cell through the bit line connected to its drain electrode.

The reference current $I_{REF}$ is preselected to be at a current level that is greater than the expected current flowing through a programmed EEPROM cell, during both cell read and programming modes, and less than the expected current flowing through an unprogrammed EEPROM cell, during both cell read and programming modes. Thus, by comparing the cell current being drawn by a selected EEPROM cell through the bit line connected to that selected EEPROM cell's drain electrode, against the reference current $I_{REF}$, the sense amplifier can detect whether the cell is programmed (i.e., at logic state "1") or unprogrammed (i.e., at logic state "0") during the read mode, and when the selected EEPROM cell becomes programmed during the programming mode.

Still another aspect of the present invention is a voltage regulation circuit which provides a regulated voltage on a bit line connected to a drain electrode of a selected EEPROM cell. The voltage to be applied to the bit line is determined by a reference voltage $V_{REF}$ which acts as one input to the voltage regulation circuit. Typically, the reference voltage $V_{REF}$ will be around 1.5 volts when the programmed memory state of the selected EEPROM cell is being read, or around 8 volts when the selected EEPROM cell is being programmed.

In the preferred embodiment of the present invention, the voltage regulation circuit includes a differential amplifier having the reference voltage as one input and the bit line voltage being regulated as another input. The difference between the two voltages is then fed back to a control gate of a "cell current control" transistor which controls the amount of current flowing to the selected EEPROM cell through the bit line whose voltage is being regulated. Consequently, when the bit line voltage exceeds the reference voltage $V_{REF}$, the differential amplifier output causes the "cell current control" transistor to turn off until the bit line voltage becomes less than or equal to the reference voltage $V_{REF}$. By thus preventing the bit line voltage from exceeding the reference voltage $V_{REF}$, the other EEPROM cells connected to the same bit line in the array of EEPROM cells, are not overstressed.

Still another aspect of the present invention is the inclusion of selection circuitry that allows the programming circuitry, including the sense amplifier, and the voltage regulation circuitry of the present invention to be shared among a plurality of EEPROM cells. In the preferred embodiment of the invention, the voltage regulation circuitry regulates a voltage located between the selection circuitry and the selected EEPROM cell. By regulating a voltage on the bit line connected to the drain electrode of the selected cell at this point, it avoids the voltage drop through the selection circuitry, thereby maintaining a more accurate regulation on the bit line voltage to the selected EEPROM cell.

Additional objects, features and advantages of the various aspects of the present invention will become apparent from the following description of its preferred embodiments, which description should be taken in conjunction with the accompanying drawings.

BRIEF DESCRIPTION OF THE DRAWINGS

FIG. 4A illustrates examples of the cell current $I_{DS}$ as a function of time for both an unprogrammed and programmed EEPROM cell having a programming voltage (e.g., 8 volts) connected between its source and drain electrodes;

FIG. 4A' illustrates an example of how the PR signal to pass gate P5 of FIG. 3, is generated in the programming mode of the present invention;

FIG. 4B illustrates examples of the cell current $I_{DS}$ as a function of time for both an unprogrammed and programmed EEPROM cell having a read voltage (e.g., 1.5 volts) connected between its source and drain electrodes;

FIG. 4B' illustrates an example of how the PR signal to pass gate P5 of FIG. 3, is generated in the read mode of the present invention;

DETAILED DESCRIPTION OF THE PREFERRED EMBODIMENT

Figure 1A:
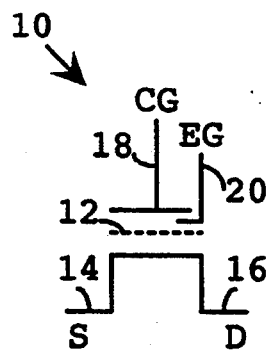
FIG. 1a illustrates a schematic representation of a typical EEPROM cell.

FIG. 1a illustrates a schematic representation of a typical EEPROM cell 10 having a floating gate 12, a source electrode 14, a drain electrode 16, a control gate electrode 18, and an erase gate electrode 20. By applying appropriate voltages to each of the EEPROM cell 10 electrodes (e.g., 14, 16, 18 and 20), the EEPROM cell 10 can be either programmed, erased or read.

Figure 1B:
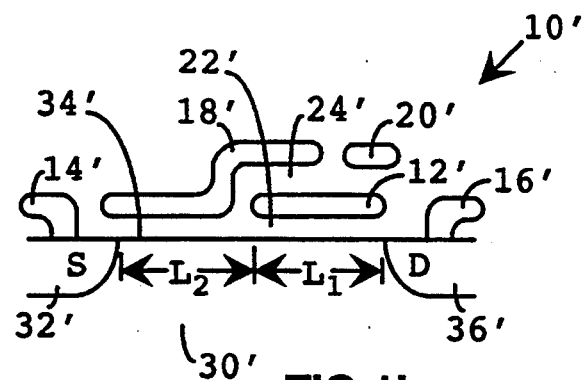
FIG. 1b illustrates a cross-sectional view of a typical EEPROM cell structure.

FIG. 1b illustrates a cross-sectional view of a typical EEPROM cell structure 10' which will be useful in describing how such EEPROM cells are programmed, erased and read. The EEPROM cell structure 10' is shown having heavily n-doped source and drain regions, 32' and 36' respectively, formed in a lightly p-doped substrate 30', a first isolation layer 22' formed over a top surface 34' of the substrate 30', gate and drain electrodes, 14' and 16' respectively, formed such that they extend through the first isolation layer 22' to provide electrical contacts to the source and drain regions, 32', and 36' respectively, a floating gate 12' formed over the first isolation layer 22', a second isolation layer 24' formed over the floating gate 12', and control and erase gate electrodes, 18' and 20', respectively, formed over the second isolation layer 24.

The EEPROM cell structure 10' can be programmed, for example, by connecting its source electrode 14' to ground, its drain electrode 16' to 8.0 volts, its control gate electrode 18' to 12.0 volts, and its erase gate electrode 20' to ground. By so doing, a substantial negative charge is transferred through the first isolation layer 22' onto the floating gate 12' from a channel region (e.g., L1 and L2) defined between the source and drain regions, 32' and 36' respectively, in the substrate 30'.

After being programmed, the EEPROM cell structure 10' can then be erased, for example, by connecting its source, drain and control gate electrodes, 14', 16' and 18', respectively, to ground, and its erase gate electrode 20' to 20.0 volts. By so doing, negative charge on the floating gate 12' is transferred through the second isolation layer 24' to the erase gate electrode 20'.

The logic state of the EEPROM cell structure 10' can be read, for example, by connecting its source electrode 14' to ground, its drain electrode 16' to 1.5 volts, its control gate electrode 18' to 5.0 volts, its erase gate electrode 20' to ground, and sensing a drain-source current, $I_{DS}$, flowing between its drain region 36' and source region 32'. By so doing, a logic "1" state is read when the resulting $I_{DS}$ is relatively small, and a logic "0" state is read when the resulting $I_{DS}$ is relatively large.

Figure 2:
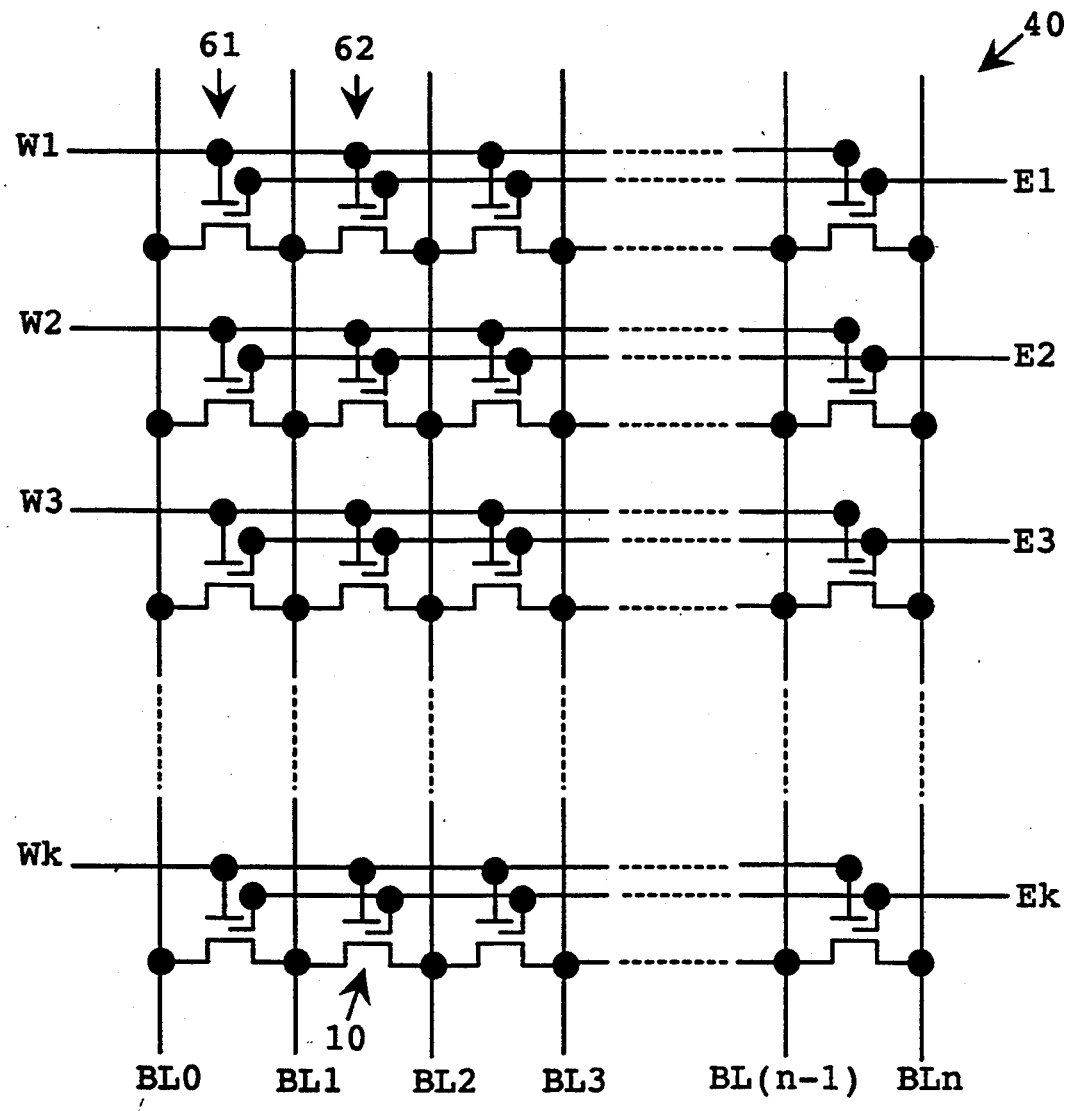
FIG. 2 illustrates a conventional virtual ground EEPROM cell array.

FIG. 2 illustrates a virtual ground EEPROM cell array 40 having a plurality of EEPROM cells similar those described in reference to FIGS. 1a and 1b, arranged in a matrix of rows and columns. The array is referred to as a virtual ground memory array, because each of the adjacent EEPROM cells shares a common source/drain region wherein the common source/drain region is used as a drain region for one of the adjacent EEPROM cells and as a source region for the other. Thus, by using such an arrangement, nearly half as many source/drain regions are required per row of EEPROM cells (e.g., for a row of 8 EEPROM cells only 9 source/drain regions are required, whereas in a conventional array of EEPROM cells, 16 source and drain regions would be required).

An EEPROM cell 10 in the EEPROM cell array 40 is then selected, for example, by providing an appropriate voltage to the word line Wk connected to its control gate, connecting its source electrode, connected to bit line BL1, to ground, and connecting its drain electrode, connected to bit line BL2, to an appropriate voltage. For example, when reading the programmed state of EEPROM cell 10, a voltage of 5.0 volts is provided to its word line Wk and a voltage of 1.5 volts is connected to its drain electrode through bit line BL2. To prevent selection of other EEPROM cells also having their control gates connected to word line Wk, all other bit lines (e.g., BL0, and BL3 to BLn) are typically allowed to "float."

Figure 3:
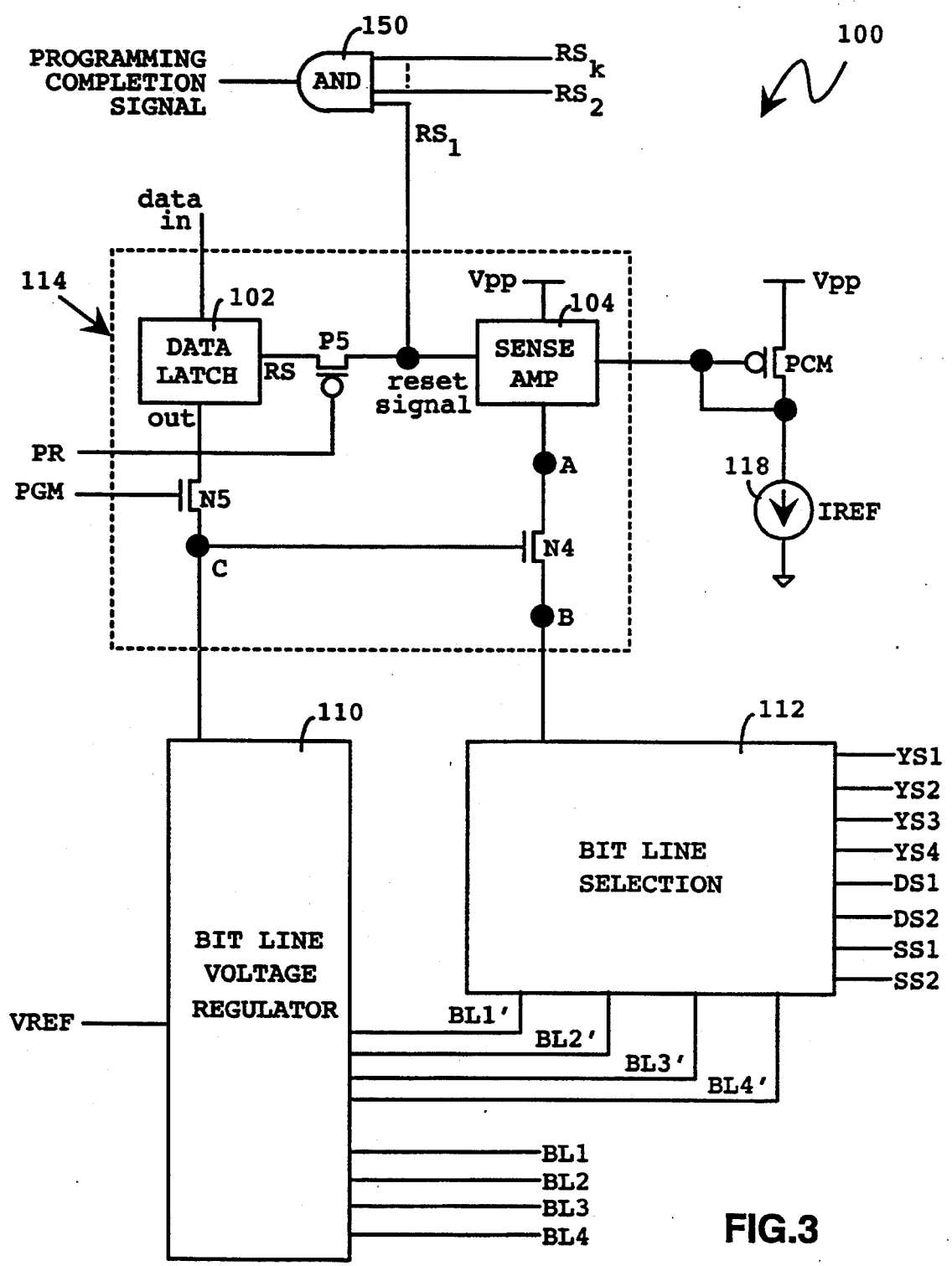
FIG. 3 illustrates a block diagram of circuitry, utilizing aspects of the present invention, for selectively programming and automatically verifying the programming of memory cells in an EEPROM cell array.

FIG. 3 illustrates a block diagram of a circuit 100, utilizing aspects of the present invention. Included in the circuit 100 is a programming circuit 114, a bit line voltage regulator circuit 110, and a bit line selection circuit 112. The programming circuit 114 further includes a data latch 102, a sense amplifier 104, a "programming control" transistor N5, a "cell current control" transistor N4, and a "reset signal control" transistor P5.

Before programming is initiated, data representing the desired program state of a selected EEPROM cell is input into data latch 102, the appropriate programming voltage (e.g., 8.0 volts) is provided to the $V_{REF}$ input of the bit line voltage regulator circuit 110, and the selected EEPROM cell is accessed by appropriate Y-select (e.g., YS1-4) and Drain/Source-select (e.g., DS1-2 and SS1-2) inputs to the bit line selection circuit 112. For example, if EEPROM cell 10 of the EEPROM cell array 40 (FIG. 2) is desired to be programmed to a logic "1" state, then a "1" is stored in data latch 102 (causing its output to be HIGH) and a proper combination of Y-select and D/S-select inputs are provided to selection circuit 112 so that bit line BL1 is connected to ground, bit line BL2 is connected to node B (i.e., connected to the source electrode of "cell current control" transistor N4), and bit lines BL3 and BL4 are left "floating" (i.e., neither connected to node B nor to ground).

Programming is then initiated when a programming signal PGM turns on "programming control" transistor N5, which in turn, allows the output of data latch 102 to turn on "cell current control" transistor N4 when the output of data latch 102 is HIGH (i.e., when the selected EEPROM cell is to be programmed). In response to the programming voltage provided by the voltage regulator 110, the selected EEPROM cell, through bit line BL2, for example, draws a cell current $I_{DS}$, which is provided by and sensed by sense amplifier 104.

Referring now to FIG. 4A, curves 201 and 203 represent examples of cell currents $I_{DS}$, as a function of time, for an unprogrammed and a programmed EEPROM cell, respectively, each having a programming voltage (e.g., 8 volts) applied across its drain and source electrodes. Referring to curve 201, when programming of the selected EEPROM cell is initiated at time t0, the selected EEPROM cell starts to draw a cell current $I_{DS}$ which builds up in time to a peak, unprogrammed current $I_1$. As charge starts to build up on the floating gate (e.g., 12' in FIG. 1b) of the selected EEPROM cell (e.g., 10), the cell current $I_{DS}$ starts to "fall" until the selected EEPROM cell is programmed, at which time the cell current $I_{DS}$ flowing through the selected EEPROM cell stabilizes at the programmed current $I_2$.

By selecting a reference current $I_{REF}$ at a current level slightly higher than that of the programmed state current $I_2$, completion of the programming process can be detected by the sense amplifier 104 when the cell current $I_{DS}$ drops to or below the reference current $I_{REF}$ at time t3. Thereupon, the sense amplifier 104 causes programming to be terminated by generating a reset signal to the data latch 102.

Figure 5:
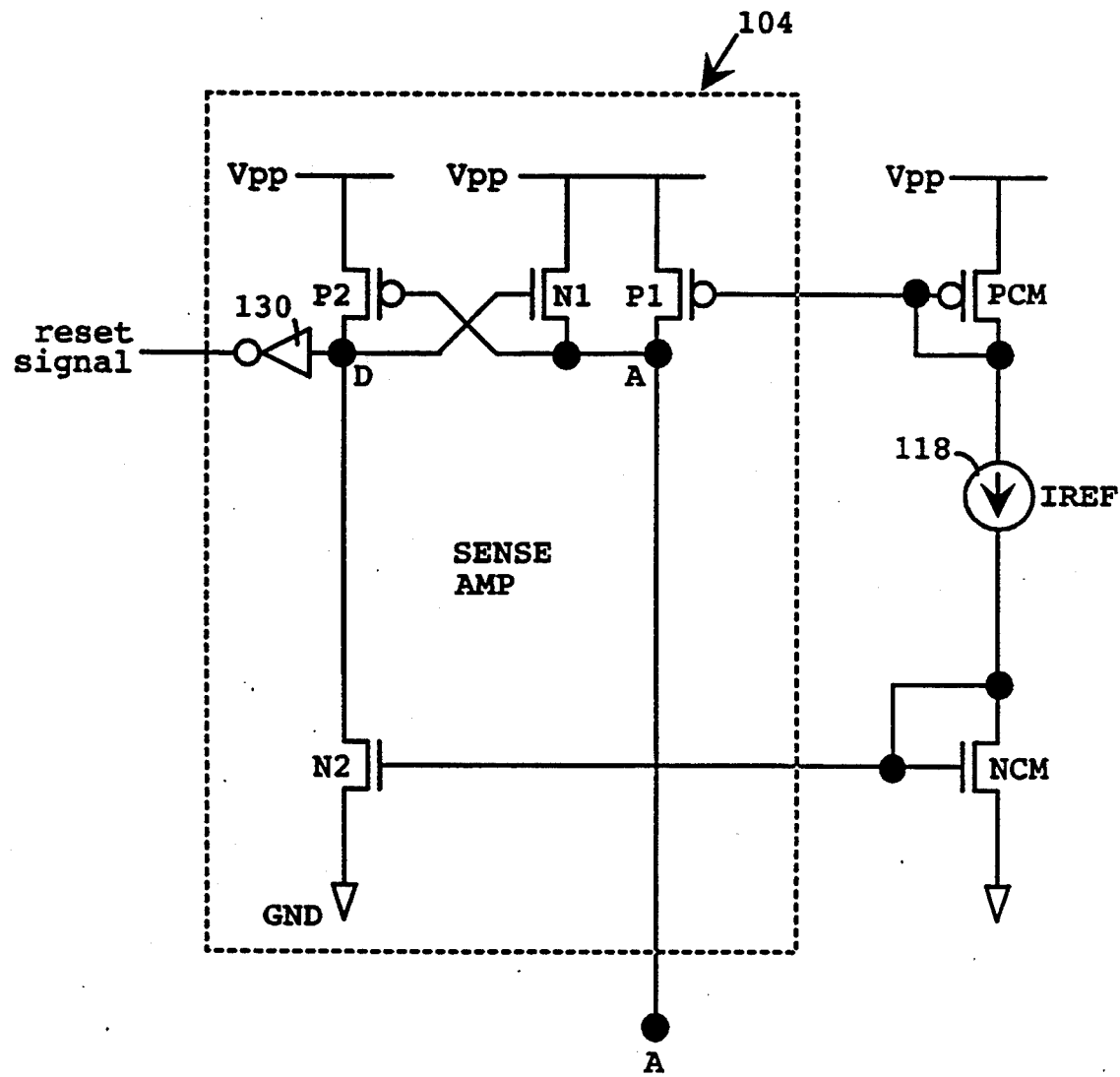
FIG. 5 illustrates, as an example, a circuit diagram of a sense amplifier, utilizing aspects of the present invention.

Referring now to FIG. 5, the sense amplifier 104 causes programming to be terminated when node D of the sense amplifier 104 goes LOW. Thereupon, since node D is the input to inverter 130, when node D goes LOW, the output of inverter 130, which is the reset signal to the data latch 102, goes HIGH, and the data latch 102 is reset, thus causing programming to stop by its output going LOW which turns off "current control" transistor N4.

Because the preferred embodiment of the sense amplifier 104, however, does not detect the difference between a rising or falling cell current $I_{DS}$, to avoid false detection of completion of the programming process at time t1 (FIG. 4A), the preferred embodiment of the programming circuit 114 includes a "reset signal control" transistor P5, which does not allow the false detection at time t1 to transmit to the reset input of the data latch 102.

FIG. 4A' illustrates how the PR signal input to the "reset signal control" transistor P5 is generated in programming mode. Briefly, the PR signal is generated by the programming signal PGM after a delay equal to or greater than t1.

Referring now to FIG. 4B, curves 202 and 204 represent examples of cell currents $I_{DS}$, as a function of time, for an unprogrammed and a programmed EEPROM cell, respectively, each having a read voltage (e.g., 1.5 volts) applied across its drain and source electrodes. When reading of the selected EEPROM cell is initiated at time t0, the selected EEPROM cell starts to draw a cell current $I_{DS}$ which builds up in time to either an unprogrammed state current $I_1'$ or a programmed state current $I_2'$ depending upon which state the selected EEPROM cell is in.

By selecting a reference current $I_{REF}'$ at a current level between that of the unprogrammed and programmed state currents, $I_1'$ and $I_2'$, an unprogrammed cell (e.g., program state "0") can be detected by the sense amplifier 104 if the cell current $I_{DS}$ rises to or above the reference current $I_{REF}'$ at time t2, and a programmed cell (e.g., program state "1") can be detected by the sense amplifier 104 if the cell current $I_{DS}$ does not reach the reference current $I_{REF}'$ within a reasonable time after time t2.

FIG. 4B' illustrates how the PR signal input to the "reset signal control" transistor P5 is generated in reading mode. Briefly, the PR signal is generated immediately after initiation of the read command signal. A delay is not required as in the programming mode, because in the reading mode, the sense amplifier 104 is detecting the rising cell current $I_{DS}$, not the falling cell current $I_{DS}$. Consequently, false detection is not a problem.

Before continuing with the description of the circuit 100 in FIG. 3, the selection of a reference current $I_{REF}$ is described. Simplistically, the reference current $I_{REF}$ should be selected as being a current level which is somewhere between a maximum current level $I_1$, drawn by an unprogrammed EEPROM cell, and a minimum current level $I_2$, drawn by a programmed EEPROM. Thereupon, by monitoring the cell current $I_{DS}$ being drawn by a selected EEPROM cell during its programming, a determination that the selected EEPROM cell has been programmed can be made when, for example, the monitored cell current $I_{DS}$ drops to or beneath the reference current $I_{REF}$.

Practically, however, the selection of an appropriate reference current $I_{REF}$ is complicated, because the maximum and minimum current levels, $I_1$ and $I_2$, respectively, can vary substantially among the memory cells of the EEPROM cell array. Such variation might arise between various memory cells of the EEPROM cell array, for example, from anomalies in the manufacturing process used to fabricate the EEPROM cell array, or it might arise, for example, from physical phenomena which gradually cause these minimum and maximum current levels, $I_1$ and $I_2$, respectively, to change for each individual EEPROM cell after repeated programmings and erasings of that EEPROM cell.

Thus, practical selection of an appropriate reference current $I_{REF}$ is preferably determined, for example, by empirically studying the expected ranges for the maximum and minimum current levels, $I_1$ and $I_2$, respectively, across various manufacturing lots and after repeated programmings and erasings of various EEPROM cells in those lots, and then, through trial and error, simulation or other techniques, determine an optimal value for the reference current $I_{REF}$ which both accurately determines, throughout the operational life of the EEPROM, when and whether any selected one of the cells in EEPROM cell array has been programmed, and does such determination in a minimal period of time.

Now continuing with the programming example, soon after programming is initiated, e.g., at time t1, the selected EEPROM cell starts to draw a cell current $I_{DS}$ that exceeds the reference current $I_{REF}$. The transistor P1 of the sense amplifier 104 (FIG. 5), however, can only provide a current level up to the reference current $I_{REF}$, because it is limited by its "current mirror" transistor PCM which is connected to current source 118 which draws a current equal to the reference current $I_{REF}$. Consequently, the sense amplifier 104 through its transistor P2, detects when the selected EEPROM cell tries to draw a cell current $I_{DS}$ which is greater than the reference current $I_{REF}$, and causes transistor N1 to conduct, wherein transistor N1 is designed to be capable of providing the required additional current (e.g., $I_1 - I_{REF}$).

Elaborating further in reference to FIG. 5, before transistor N4 is turned on (and, in general, when no current flows through that device), transistor N1 is off. Also, whenever a current less than $I_{REF}$ is drawn from transistor P1, the gate of transistor P2 is pulled high enough such that the current it can supply becomes smaller than the current of the pull-down transistor N2, which is equal to $I_{REF}$, and as a consequence, the gate of the transistor N1 is kept LOW.

As previously described, when the selected cell to be programmed begins to conduct current, the current $I_{DS}$ quickly becomes higher than $I_{REF}$ (e.g., at time t1 in FIG. 4A), so it cannot be supplied by transistor P1 alone. The node A is consequently pulled towards ground, turning on transistor P2. Since transistor P2 has been designed to be capable of overpowering transistor N2 (for example, by making P2 a larger transistor than N2), it thereupon overcomes the pull-down transistor N2, and as a consequence, causes transistor N1 to turn on. By thus turning transistor N1 on, additional current is thereupon provided to node A to satisfy the current (e.g., $I_1$) being drawn by the selected EEPROM cell being programmed.

As previously described, as long as the selected cell draws more current $I_{DS}$ than the reference current $I_{REF}$, node A is being pulled down towards ground and as a consequence, transistor P2 is turned on, keeping the voltage at node D HIGH by overpowering calibrated transistor N2 and pulling the voltage at node D up to Vpp. When the selected cell no longer draws more current $I_{DS}$ than the reference current $I_{REF}$, node A is no longer pulled down towards ground by the selected cell and is instead, pulled up to Vpp by transistor P1. With node A thus pulled up to Vpp, transistor P2 turns off and calibrated transistor N2, acting as a current sink equal to the reference current $I_{REF}$, pulls node D down to ground, thus making node D logically LOW.

As thus described, the programming circuitry 114, including the data latch 102, sense amplifier 104, "programming control" transistor N5, "cell current control" transistor N4, and "reset signal control" transistor P5, simultaneously programs and verifies the programming of a selected EEPROM cell. Programming of the selected EEPROM cell is optimized, because the programming duration for any particular cell does not exceed the time required for efficiently programming that cell. Further, since verification is occurring simultaneously, time is not wasted by conducting the verification or read mode separately from the programming mode as in prior art techniques and related circuitry.

As an additional aspect of the present invention, the voltage on the bit line connected to the drain electrode of the selected cell is regulated by bit line voltage regulation circuit 110. By regulating the voltage on the bit line, memory cells other than the selected EEPROM cell, which are also connected to the bit line (refer to FIG. 2 for example), will not be inadvertently programmed or overstressed.

Figure 6:
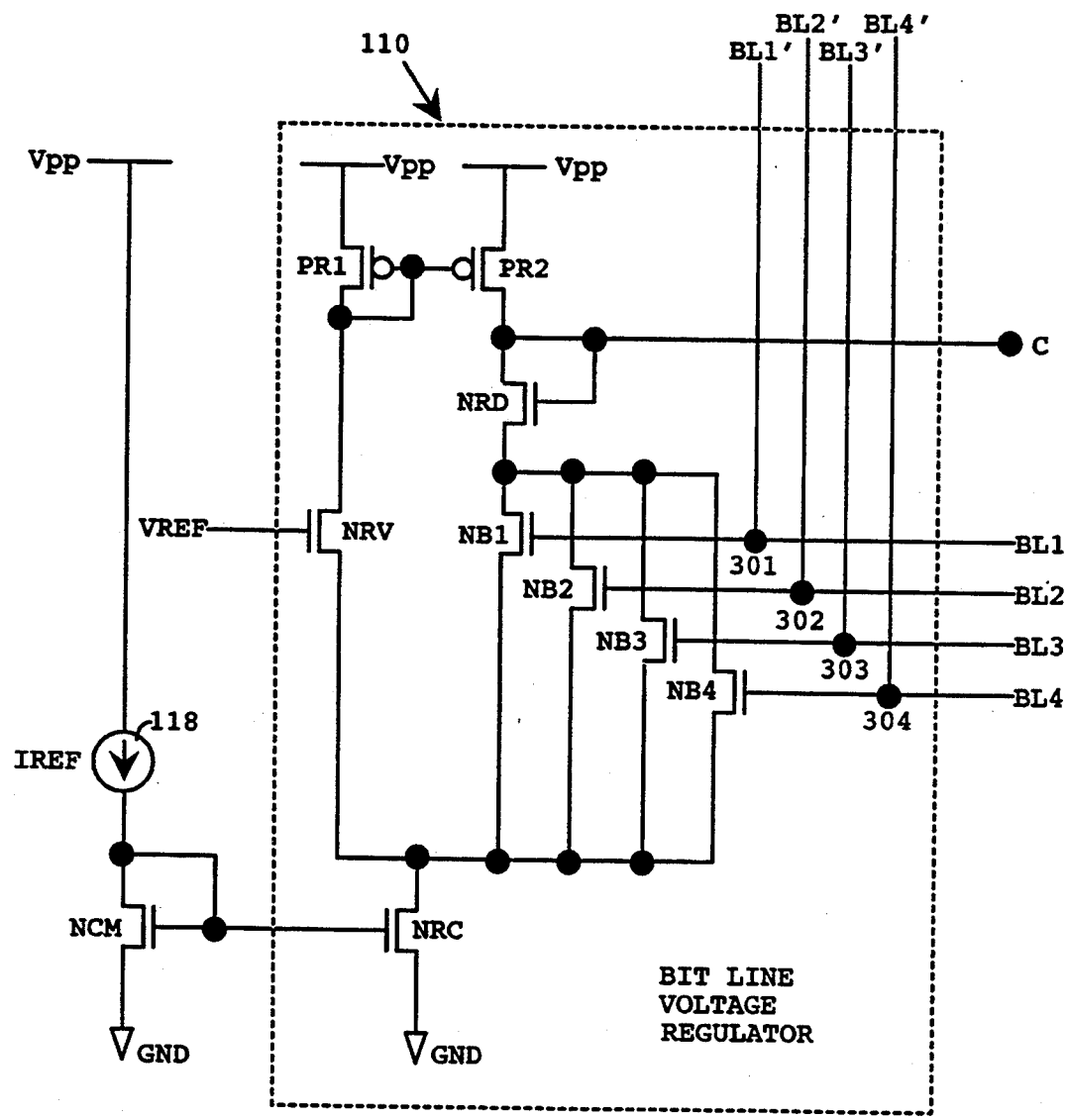
FIG. 6 illustrates, as an example, a circuit diagram of a bit line voltage regulator circuit, utilizing aspects of the present invention.

FIG. 6 illustrates one implementation, utilizing aspects of the present invention, of the bit line voltage regulation circuit 110 of FIG. 3. A differential amplifier including transistors PR1 and PR2, has as one input at a control gate of transistor NRV, the reference voltage $V_{REF}$ (e.g., 1.5 volts for read mode and 8.0 volts for programming mode), and as a second input at a control gate of one of the transistors NB1–NB4, a voltage from a selected one of the bit lines (e.g., BL1–BL4). The output of the differential amplifier, taken at the drains of transistors PR2 and NRD (wherein transistor NRD acts to effectively disconnect the voltage regulator's feedback path to node C when the output of the data latch is LOW), is then connected to the control gate of the "current control" transistor N4 through node C, so that whenever the bit line voltage on the selected bit line exceeds the reference voltage $V_{REF}$, the "current control" transistor N4 is turned off.

Referring now to FIGS. 3 and 6, the voltage regulator circuit 110 is connected, at nodes 301–304, to a plurality of bit lines BL1'–BL4', respectively, coming from the bit line selection circuit 112, and a plurality of bit lines BL1–BL4 going to their respective memory cells in an EEPROM cell array (e.g., 40 in FIG. 2). Bit lines BL1'–BL4' are differentiated from bit lines BL1–BL4 by an apostrophe to emphasize that it is the voltage at one of the nodes 301–304 (connecting the two sets of bit lines) which is being regulated. By positioning and connecting the voltage regulation circuit 110 between the selection circuitry 112 and the EEPROM cells as shown in FIG. 3, the voltage at nodes 301–304 do not reflect the resistive and capacitive effects of the selection circuitry 112, thus they provide a cleaner and more accurate reference voltage to the EEPROM cells through their respective bit lines BL1–BL4, and also, the voltage regulation circuit 110 can be shared between a plurality of bit lines (the number of which is only limited by example in FIGS. 3 and 6), thus saving circuit costs by avoiding redundant voltage regulation circuitry along each bit line.

Figure 7:
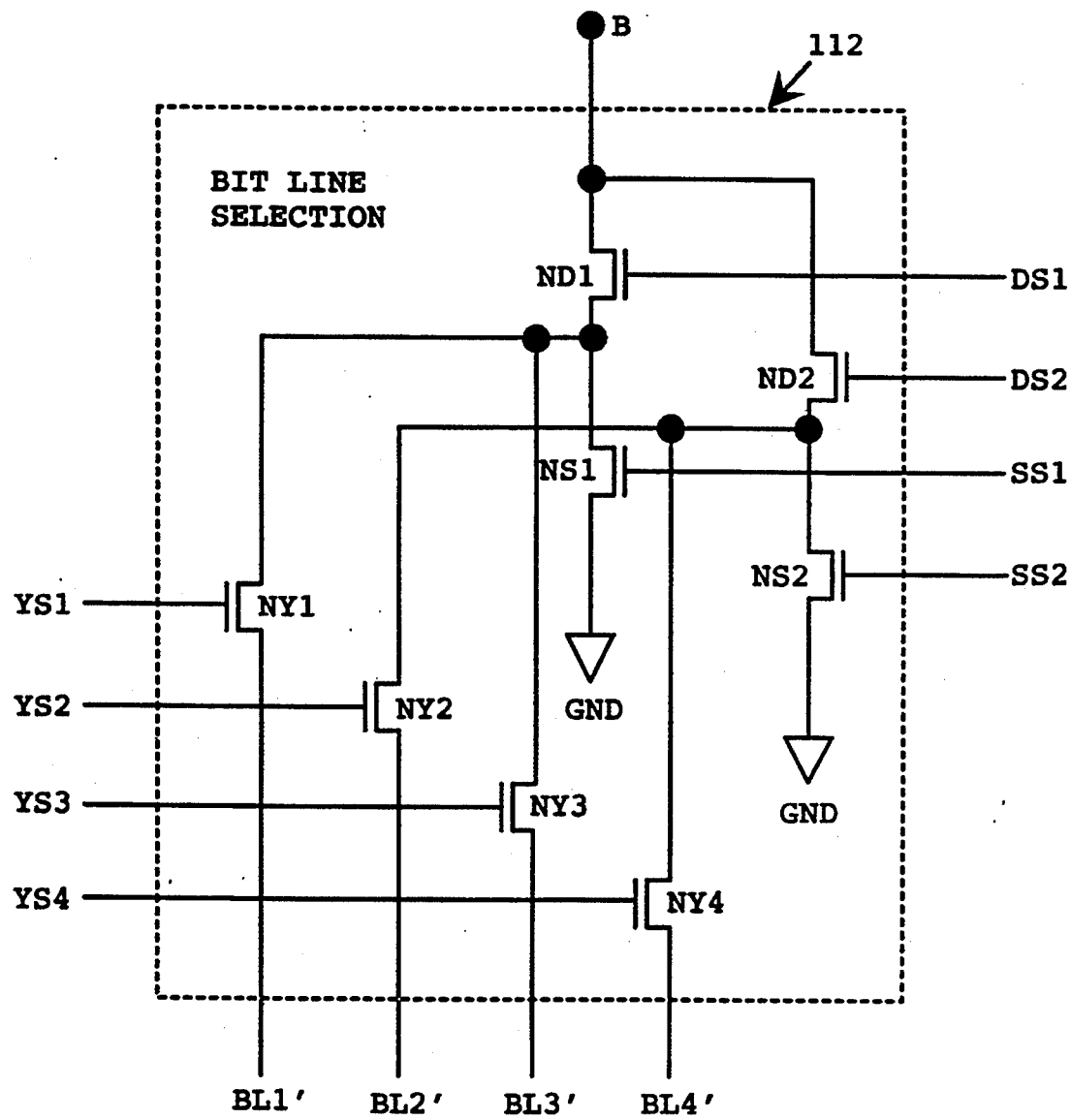
FIG. 7 illustrates, as an example, a bit line selection circuit, which in combination with other circuitry in FIG. 3, utilizes aspects of the present invention.

FIG. 7 illustrates one implementation of the bit line selection circuitry 112 of FIG. 3, which in combination with the other circuitry of FIG. 3, utilizes aspects of the present invention. In particular, the selection circuitry 112 allows the programming circuitry 114, including the sense amplifier 104, and the voltage regulation circuitry 110 to be shared among a plurality of bit lines, thus reducing overall circuit requirements on a single integrated circuit EEPROM and as a consequence, reducing the EEPROM's die size and cost.

As is readily apparent by trying out various combinations of the Y-select inputs (e.g., YS1–YS4) and the Drain-Source select inputs (e.g., DS1-2 and SS1-2), various combinations of connecting each of the bit lines (e.g., BL1'–BL4') to either the programming circuitry at node B, or to ground, or left "floating" can be implemented. For example, if EEPROM cell 10 is to be selected in the EEPROM cell array 40 (FIG. 2), bit line BL1' will be connected to ground by making YS1 HIGH, DS1 LOW and SS1 HIGH, bit line BL2' will be connected to node B by making YS2 HIGH, DS2 HIGH and SS2 LOW, while bit lines BL3' and BL4' are left "floating" by making YS3 and YS4 LOW, respectively.

Figure 8:
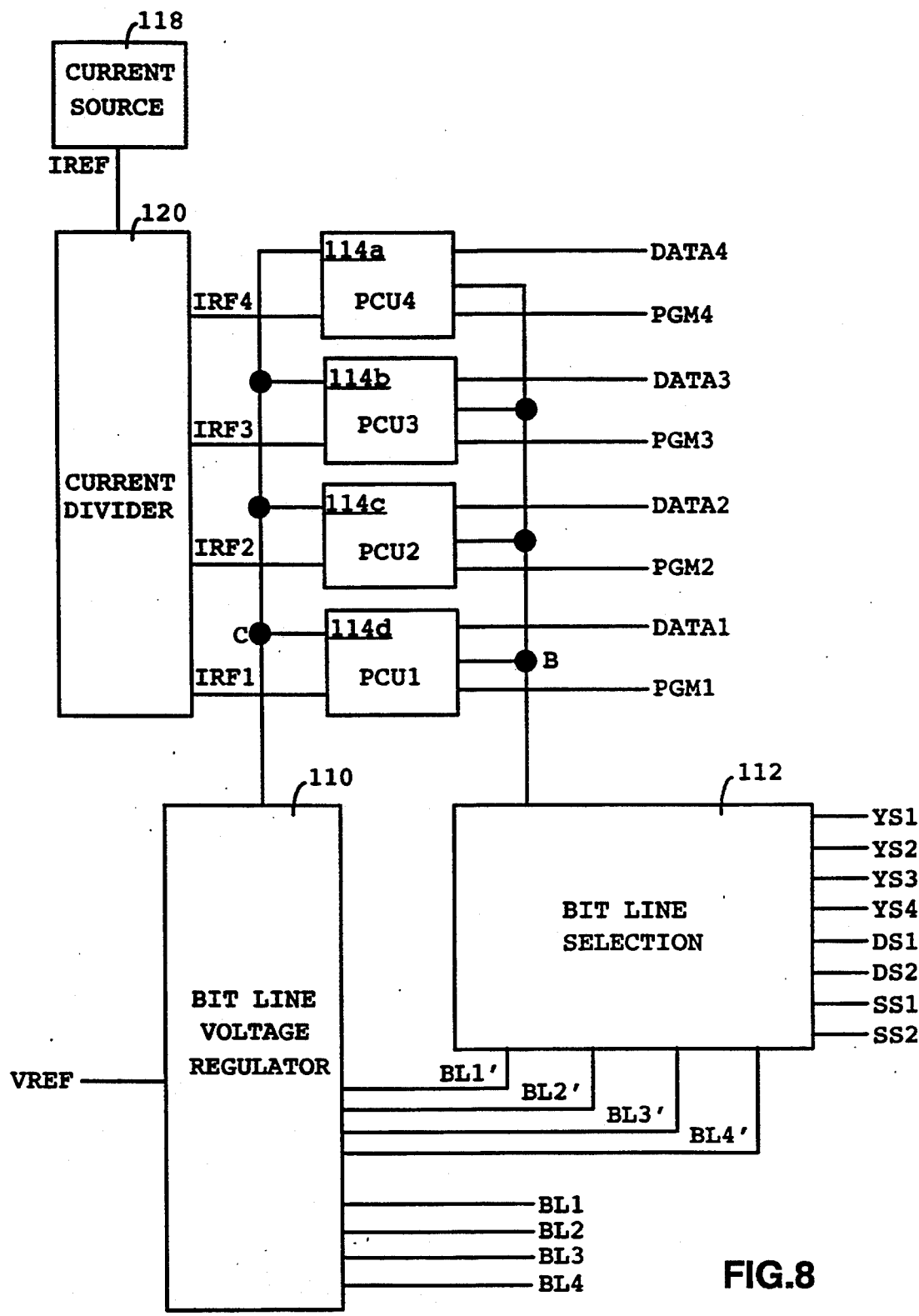
FIG. 8 illustrates a block diagram of circuitry, utilizing aspects of the present invention, for selectively programming and automatically verifying the programming of multi-state memory cells in an EEPROM cell array.

FIG. 8 illustrates, as an example, a block diagram of circuitry, utilizing aspects of the present invention, for selectively programming and automatically verifying the programming of multi-state memory cells in an EEPROM cell array. Since multi-state memory cells can be programmed to more than the two (e.g., programmed or unprogrammed) states which have been discussed so far, additional programming circuitry is required.

In FIG. 8, a plurality of programming circuits (e.g., PCU1–PCU4), each similar in construction to that shown as programming circuit 114 in FIG. 3, are each connected (e.g., at node B) to the bit line selection circuit 112 and connected (e.g., at node C) to the bit line voltage regulator circuit 110. A current source 118 generating a current $I_{REF}$, is connected to a current divider 120 which generates a plurality of reference currents IRF1–IRF4, one for each of the plurality of programming circuits PCU1–PCU4, wherein each of the plurality of reference currents IRF1–IRF4 corresponds to one of the programmable states of the multi-state memory cell. By proper selection of reference currents IRF1–IRF4, utilizing techniques similar to that used in selecting the reference current $I_{REF}$ for the two-state memory cell as previously described, programming circuits PCU1–PCU4 can each program and automatically verify the programming of a separate one of the plurality of memory states.

Figure 9:
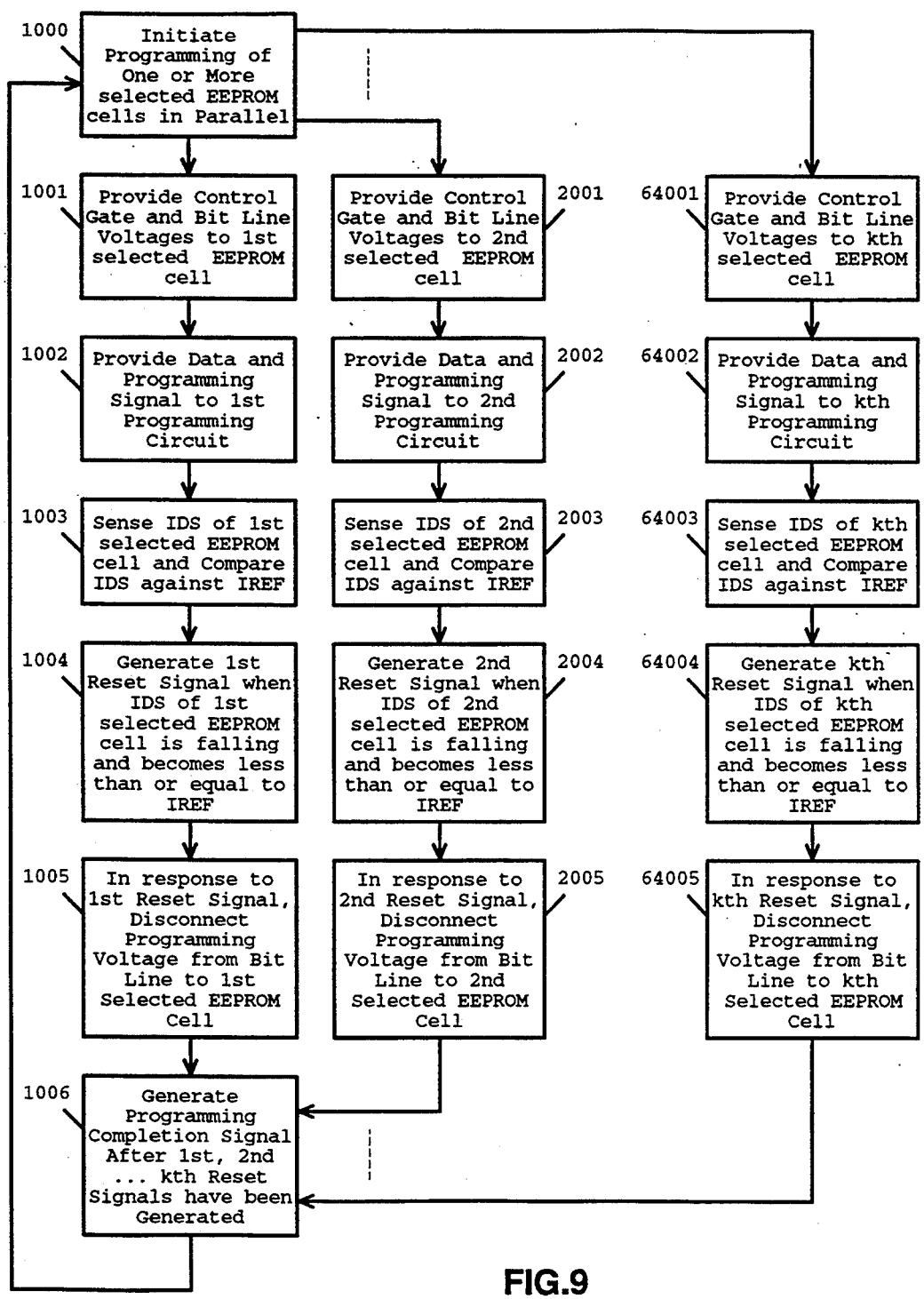
FIG. 9 illustrates a flow diagram of a method, utilizing aspects of the present invention, for sequentially programming a plurality of sets of EEPROM cells, wherein the EEPROM cells in each set is programmed in parallel.

Finally, FIG. 9 illustrates a flow diagram of a method, utilizing aspects of the present invention, for sequentially programming a plurality of sets of EEPROM cells, wherein the EEPROM cells in each set are programmed in parallel. Although the description so far has only described the programming of a single EEPROM cell at a time, the various aspects of the present invention are also equally applicable to systems designed to sequentially program sets of EEPROM cells wherein each set (e.g., 64 cells) of EEPROM cells is programmed in parallel.

In step 1000, the programming of a set of EEPROM cells is initiated. Typically, this is done by either an on-chip or off-chip processor. Thereupon, the same steps as steps 1001–1005 for a first cell in the set of EEPROM cells, are conducted in parallel for each of the EEPROM cells in the first set of EEPROM cells to be programmed. For example, steps 2001–2005 are conducted for a second cell in the set of EEPROM cells, and steps 64001–64005 are conducted for a kth cell in the set of EEPROM cells in parallel with steps 1001–1005 for the first cell. Typically, steps 1001–1002 are done by on-chip control circuitry, and steps 1003–1005 are done by on-chip programming circuitry.

Briefly, steps 1001–1005 and their respective steps for other cells in the set of EEPROM cells, include, for example, in step 1001, providing the appropriate programming control gate and bit line voltages (e.g., 12 volts to the control gate of the selected EEPROM cell, ground to the bit line connected to the source electrode of the selected EEPROM cell, and 8 volts to the bit line connected to the drain electrode of the selected EEPROM cell) to each of the EEPROM cells selected to be programmed in the first set of EEPROM cells; in step 1002, providing data to be programmed into each of the EEPROM cells selected to be programmed in the first set of EEPROM cells, and providing a programming signal to initiate the programming in each of EEPROM cells selected to be programmed in the first set of EEPROM cells; in step 1003, sensing the cell current $I_{DS}$ of each of the EEPROM cells selected to be programmed in the first set of EEPROM cells and comparing the sensed cell current $I_{DS}$ against a reference current $I_{REF}$ (selected in a similar manner to that previously described in reference to FIGS. 3–5); in step 1004, generating a reset signal for each of the EEPROM cells selected to be programmed in the first set of EEPROM cells when the sensed cell current $I_{DS}$ for that EEPROM cell is falling and becomes less than or equal to its respective $I_{REF}$; and in step 1005, in response to their respective reset signals, disconnecting the provided programming voltage (e.g., 8 volts) to at least the drain electrode of the EEPROM cell, for each of the EEPROM cells selected to be programmed in the first set of EEPROM cells.

In step 1006, a programming completion signal is then generated after all of the cells in the first set of EEPROM cells has been programmed. Typically, this is done by on-chip logic circuitry. Since each of the cells being programmed may take a different amount of time to be programmed, the programming of a next set of EEPROM cells must wait until the last cell in the first set of EEPROM cells has been programmed. A logic means for generating the programming completion signal is shown, for example, in FIG. 3 by AND gate 150 which receives each of the reset signals $RS_1$ to $RS_k$ generated after each of the EEPROM cells selected to be programmed in the first set of EEPROM cells has been programmed.

The programming completion signal can then be read by an off-chip processing unit, for example, so that initiation of programming a next set of EEPROM cells can be conducted by repeating steps 1000–1006 for each of the next set of EEPROM cells to be programmed. Thereupon, the off-chip processing unit (wherein it is to be understood that references to an off-chip processing unit apply equally to an on-chip processing unit) can control the necessary voltage, data and signal providing requirements of steps 1001–1003, which steps can occur in the order shown or simultaneously.

Generation of the programming completion signal is also useful when a plurality of EEPROM cells are being sequentially programmed one cell at a time. For example, if an off-chip processing unit is controlling the programming of the EEPROM cells, the off-chip processing unit needs some type of indication from the EEPROM that programming of an EEPROM cell has completed, so that it can initiate the programming of a next EEPROM cell. In the prior art program-verify technique, the off-chip processing unit typically controlled both the program pulse and subsequent verify modes, therefore the off-chip processing unit knew when programming of a selected cell was completed by the result of the verify mode. In the present invention, the off-chip processing unit does not conduct a verify mode, therefore the programming completion signal serves to indicate to the off-chip processing unit that programming of a selected EEPROM cell has completed, so that the off-chip processing unit can initiate the programming of a next EEPROM cell.

Although the various aspects of the present invention have been described with respect to a preferred embodiment, it will be understood that the invention is entitled to full protection within the full scope of the appended claims.

What is claimed is:

1. A method of programming an EEPROM cell, comprising the steps of:
   providing a first voltage to a control gate of said EEPROM cell, connecting a drain electrode of said EEPROM cell to a second voltage, and connecting a source electrode of said EEPROM cell to ground, wherein said first and second voltages are of sufficient magnitude to program said EEPROM cell;
   sensing a current flowing between said drain and source electrodes of said EEPROM cell while said drain electrode of said EEPROM cell is connected to said second voltage, and comparing said sensed current against a reference current, wherein said reference current is greater than an expected current level for said EEPROM cell after it is programmed and less than an expected current level for said EEPROM cell before it is programmed; and
   disconnecting said drain electrode of said EEPROM cell from said second voltage when said sensed current is falling and becomes less than or equal to said reference current, and generating a programming completion signal when said sensed current is falling and becomes less than or equal to said reference current.

2. A method of programming a plurality EEPROM cells, comprising the steps of:
   (a) providing appropriate voltages, sufficient to program a first set of said plurality of EEPROM cells, to a control gate, a drain electrode, and a source electrode of each cell of said first set of said plurality of EEPROM cells;
   (b) sensing a current flowing between said drain and source electrodes of each cell of said first set of said plurality of EEPROM cells, and comparing said sensed current for each cell of said first set of said plurality of EEPROM cells against a reference current, wherein said reference current is greater than an expected current level for each cell of said first set of plurality of EEPROM cells after each cell of said first set of plurality of EEPROM cells is programmed and less than an expected current level for each cell of said first set of plurality of EEPROM cells before each cell of said first set of plurality of EEPROM cells is programmed; and
   (c) disconnecting said drain electrode of each cell of said first set of said plurality of EEPROM cells from said appropriate voltages when said sensed current for that EEPROM cell is falling and becomes less than or equal to said reference current, and generating a programming completion signal after the sensed current for all of said first set of said plurality of EEPROM cells has fallen and become less than or equal to said reference current.

3. The method as recited in claim 2, further comprising the steps of detecting said programming completion signal and repeating steps (a) to (c) for another set of a plurality of EEPROM cells following such detection.

* * * * *